US012614891B2

(12) United States Patent
Collins et al.

(10) Patent No.: US 12,614,891 B2
(45) Date of Patent: Apr. 28, 2026

(54) OPTICAL ELEMENT DISPLACEMENT DETECTION CIRCUIT

(71) Applicant: STMicroelectronics (Research & Development) Limited, Marlow (GB)

(72) Inventors: Steven Collins, Dalkeith (GB); Graeme Storm, Kirkliston (GB); Supriya Raveendra Hegde, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 950 days.

(21) Appl. No.: 17/840,949

(22) Filed: Jun. 15, 2022

(65) Prior Publication Data

US 2023/0411928 A1 Dec. 21, 2023

(51) Int. Cl.
| | |
|---|---|
| *H01S 5/068* | (2006.01) |
| *H01S 5/02257* | (2021.01) |
| *H05B 47/105* | (2020.01) |
| *H01S 5/0683* | (2006.01) |

(52) U.S. Cl.
CPC ...... *H01S 5/06808* (2013.01); *H01S 5/02257* (2021.01); *H05B 47/105* (2020.01); *H01S 5/0683* (2013.01)

(58) Field of Classification Search
CPC .... H01S 5/0087; H01S 5/005; H01S 5/02257; H01S 5/06808; H01S 5/042; H05B 47/105
See application file for complete search history.

(56) References Cited

U.S. PATENT DOCUMENTS

| | | | |
|---|---|---|---|
| 6,531,341 B1 | 3/2003 | Peterson et al. | |
| 6,809,403 B2 | 10/2004 | Gee | |
| 7,432,489 B2 | 10/2008 | Pileri et al. | |
| 9,194,751 B1 | 11/2015 | Yap et al. | |
| 10,290,993 B2 | 5/2019 | Chen et al. | |
| 10,527,703 B2 * | 1/2020 | Monreal | G01R 33/075 |
| 10,587,090 B1 | 3/2020 | Raring et al. | |
| 10,670,724 B2 | 6/2020 | Moon et al. | |
| 10,738,985 B2 * | 8/2020 | Hannan | H01S 5/06825 |
| 10,777,710 B2 | 9/2020 | Coffy et al. | |
| 2019/0250257 A1 | 8/2019 | Finkelstein et al. | |
| 2019/0379173 A1 | 12/2019 | Coffy et al. | |
| 2020/0278426 A1 | 9/2020 | Dummer et al. | |
| 2021/0152766 A1 | 5/2021 | Byun | |

(Continued)

FOREIGN PATENT DOCUMENTS

| | | |
|---|---|---|
| CN | 107222228 A | 9/2017 |
| DE | 102018120508 A1 | 2/2020 |
| WO | 2020038066 A1 | 2/2020 |

(Continued)

OTHER PUBLICATIONS

EPO Search Report and Written Opinion for counterpart EP Appl. No. 23177887.9, report dated Nov. 3, 2023, 7 pgs.

*Primary Examiner* — Michael Carter
(74) *Attorney, Agent, or Firm* — Crowe & Dunlevy LLC

(57) ABSTRACT

An optical element is positioned in a holder over a laser light source. The optical element includes an electrical trace that is coupled between first and second pads. A sensing circuit that is also coupled to the first and second pads performs a voltage/current sensing operation to detect displacement of the optical element and control enablement of the laser light source.

26 Claims, 5 Drawing Sheets

(56)         References Cited

U.S. PATENT DOCUMENTS

2021/0343762  A1    11/2021  King et al.
2021/0384703  A1    12/2021  Watkins et al.

FOREIGN PATENT DOCUMENTS

WO         2020038776  A1     2/2020
WO         2020197496  A1    10/2020
WO         2022005389  A1     1/2022

* cited by examiner

OPTICAL ELEMENT DISPLACEMENT DETECTION CIRCUIT

TECHNICAL FIELD

The present disclosure generally concerns an optical device including a laser light source with an overlying optical element and, in particular, a circuit for automatically disabling the laser light source in response to detecting displacement of the overlying optical element.

BACKGROUND

Reference is made to FIG. 1 which shows a cross-sectional view of an optical device 10. The device 10 includes a support substrate 12 with an integrated electrical connection network 14 that electrically connects electrical pads 16 on the front side of the substrate 12 to electrical pads 18 on the back side of the substrate 12. The support substrate 12 may, for example, comprise a printed circuit board (PCB). An integrated circuit light source 20 is mounted to the front side of the substrate 12 and electrically connected to the electrical pads 16. The integrated circuit light source 20 may comprise, for example, a vertical cavity surface emitter laser (VCSEL), a light emitting diode (LED) or an edge emitting laser that is selectively actuated to emit light 26. In an embodiment, a control integrated circuit 22 is also mounted to the front side of the substrate 12 and electrically connected to the electrical pads 16. Alternatively, the control integrated circuit 22 and the integrated circuit light source 20 may be stacked. The control integrated circuit 22 is electrically connected to the integrated circuit light source 20 and is functionally operable to control operation of the integrated circuit light source 20. For example, the control integrated circuit 22 may include a driver circuit for driving the light emission function of the integrated circuit light source 20.

The integrated circuit light source 20 may emit the light 26 with a high optical power over a narrow field of view. This intensity of light 26 can exceed eye safety thresholds and result in retinal damage. However, the total amount of power that can be transmitted in a safe way can exceed a baseline limit if an optical element 40 (such as a diffuser lens) is added to the optical device 10. This is shown in FIG. 2. A holder 42 is mounted to the front side of the substrate 12. The optical element 40 is received by and secured to the holder 42 in a position over the light source 20.

There are concerns, however, with the possibility for the optical element 40 to be displaced (for example, removed, fall out or become damaged) in which case a user may be inadvertently exposed to the light 26 with an intensity that exceeds the eye safety threshold. To address this concern, it is known in the art to include a circuit means for detecting optical element 40 displacement. See, for example, U.S. Pat. Nos. 10,290,993, 10,738,985 and 10,777,710 and United States Patent Application Publication No. 2021/0384703 and U.S. patent application Ser. No. 17/186,179 (all of which are incorporated herein by reference).

One means for detecting optical element displacement is shown in FIG. 3. Like reference numbers in FIG. 3 refer to same or similar parts as shown in FIGS. 1 and 2 and previously described herein. The optical element 40 is configured to include an electrical trace 50 and a sensing circuit is included with the control integrated circuit 22 and ohmically connected to opposite ends of the electrical trace 50 through the holder 42. This electrical trace 50 may, for example, be provided to extend along a surface of the optical element 40. The surface may, for example, be a side (edge) surface or bottom surface of the lens 40. To detect the presence and proper positioning of the optical element 40, the control integrated circuit 22 can apply a voltage to or a current through the electrical trace 50. The voltage and/or current is then sensed by the sensing circuit of the control integrated circuit 22 to confirm presence of the optical element 40. In response thereto, the driver circuit of the control integrated circuit 22 is enabled to drive the operation of the light source 20 to provide light 26 output.

There is a need in the art for an improved sensing circuit for detecting optical element 40 displacement.

SUMMARY

An optical device comprises: an optical element positioned over a laser light source; a driver circuit configured to drive said laser light source in response to an enable signal; and a conductive trace provided at said optical element. The conductive trace is coupled between a first pad and a second pad. A sensing circuit is provided to detect damage and/or displacement of the optical element with the conductive trace. In response to such detection, the enable signal is controlled to disable the laser light source.

In an embodiment, the sensing circuit comprises: a first current source is configured to source a first current to a first resistive divider circuit which includes said conductive trace; a second current source is configured to source a second current to a second resistive divider circuit configured to output a high reference voltage and a low reference voltage; a first comparator circuit has a first input coupled to receive a voltage at the first pad and a second input coupled to receive the high reference voltage; a second comparator circuit has a first input coupled to receive a voltage at the second pad and a second input coupled to receive the low reference voltage; and a combinational logic circuit is configured to logically combine digital signals output from the first and second comparator circuits to generate said enable signal.

In another embodiment, the sensing circuit comprises: a current source is configured to source a current to the first pad; a current comparator circuit is configured to compare a sense current output from the second pad to a reference current; a differential amplifier is configured to a sense a difference in voltage between the first and second pads; a voltage comparator circuit is configured to compare the sensed difference in voltage to a reference voltage; and a combinational logic circuit is configured to logically combine digital signals output from the current and voltage comparator circuits to generate said enable signal.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
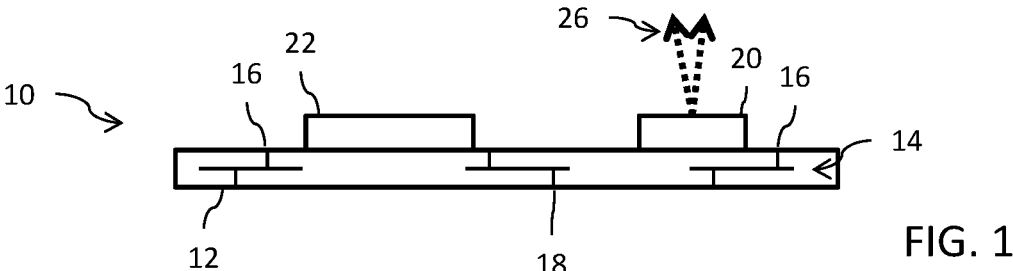
FIG. 1 is a cross-sectional view of an optical device.
Figure 2:
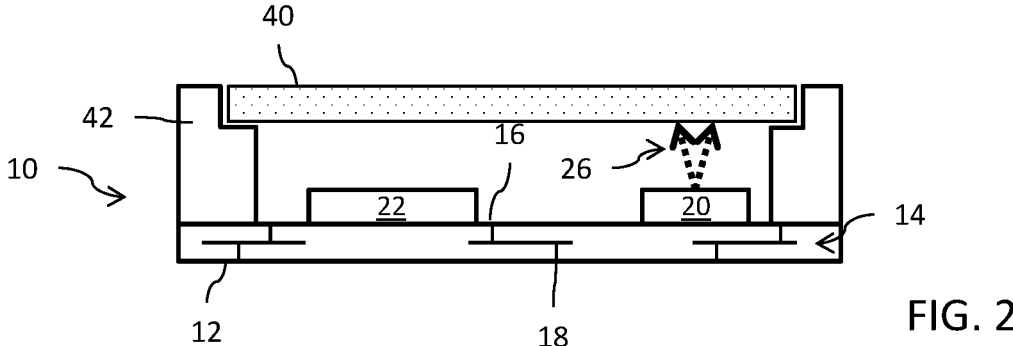
FIG. 2 is a cross-sectional view of an optical device with a lens secured by a lens holder.
Figure 3:
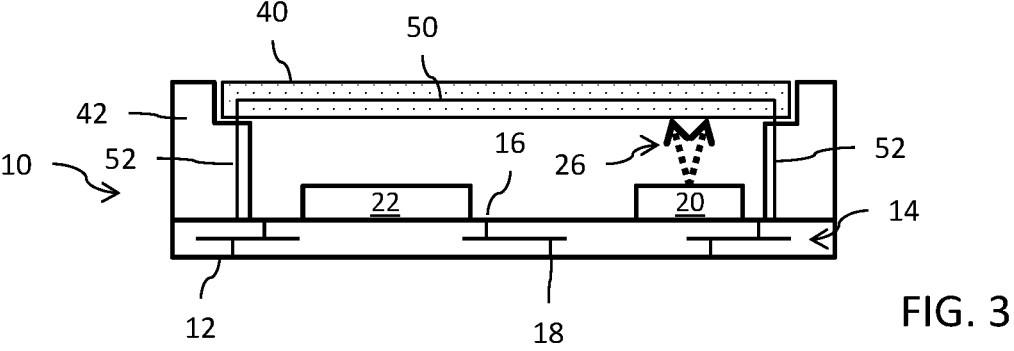
FIG. 3 is a cross-sectional view of an optical device with a lens and a lens displacement detection circuit.

The same elements have been designated with the same reference numerals in the different drawings. In particular, the structural and/or functional elements common to the different embodiments may be designated with the same reference numerals and may have identical structural, dimensional, and material properties.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

The terms "about", "substantially", and "approximately" are used herein to designate a tolerance of plus or minus 10%, preferably of plus or minus 5%, of the value in question.

Figure 4:
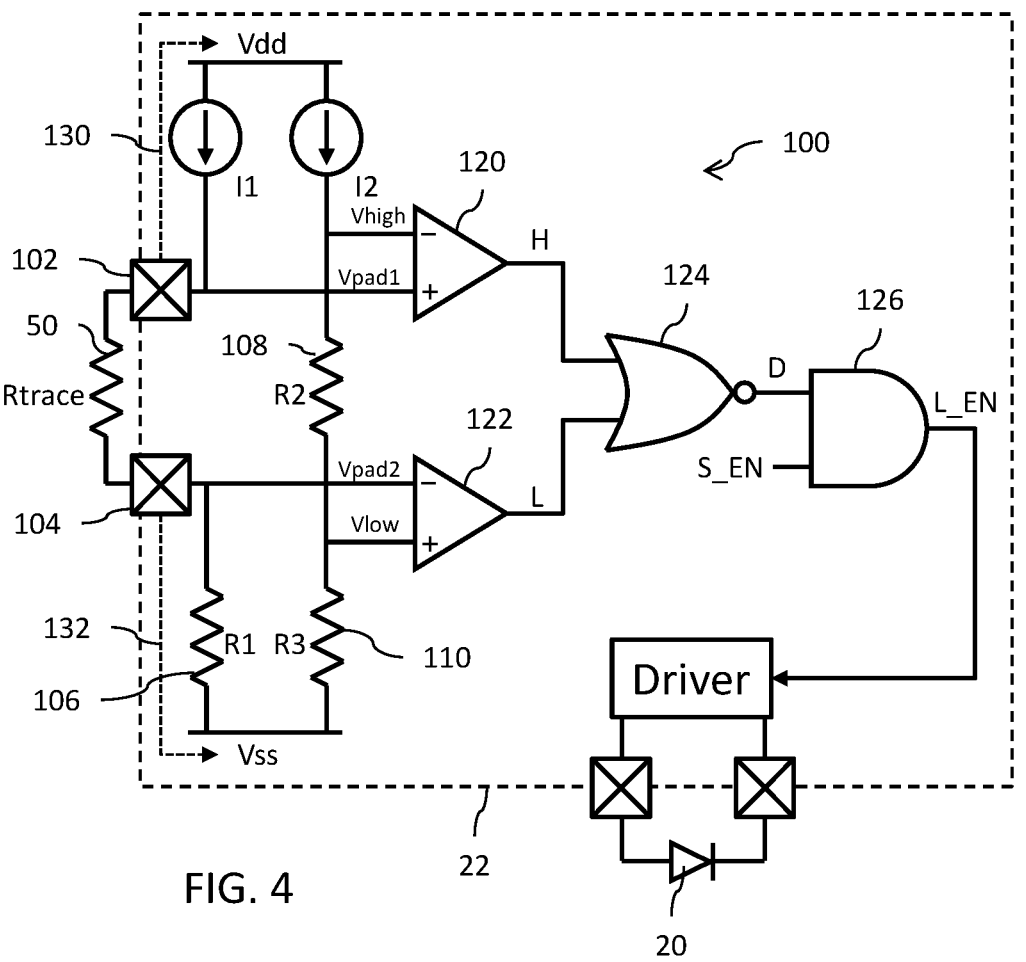
FIG. 4 is a circuit diagram for the lens displacement detection circuit.

Reference is now made to FIG. 4 which shows a circuit diagram for a sensing circuit 100 that is included within the control integrated circuit 22. The optical element 40 includes the electrical trace 50 which is represented here by a resistance Rtrace. As an example, Rtrace=250$\Omega$ (although it will be understood that the resistance Rtrace may have a different value dependent on design parameters). A first end of the electrical trace 50 is coupled to a first pad 102 of the control integrated circuit 22 through an electrical connection provided by the integrated electrical connection network 14 and the holder 42. A second end of the electrical trace 50 is coupled to a second pad 104 of the control integrated circuit 22 through an electrical connection provided by the integrated electrical connection network 14 and the holder 42. A first current source I1 powered from a positive supply voltage node Vdd sources a current to the first pad 102. The current from the first current source I1 may, for example, have a value of 200 $\mu$A. A first resistor 106 having a resistance R1 has a first terminal coupled, preferably directly connected, to the second pad 104 and a second terminal coupled, preferably directly connected, to a reference supply voltage node Vss (for example, ground). As an example, R1=4 k$\Omega$. The electrical trace 50 and the first resistor 106 form a first resistive voltage divider circuit having a first voltage tap (Vpad1) at the first pad 102 and a second voltage tap (Vpad2) at the second pad 104. When the optical element 40 is properly in place within the holder 42, the current sourced from the first current source I1 flows through the electrical trace 50 and the first resistor 106. In this condition, with Rtrace=250$\Omega$, Vpad1=0.85V and Vpad2=0.8V.

A second current source I2 powered from the positive supply voltage node Vdd sources a current to the first terminal of a second resistor 108 having a resistance R2. The current from the second current source I2 may, for example, in a first instance have a same value as the first current source I1 (for example, 200 $\mu$A) and in another instance have a value of 20 $\mu$A in order to reduce power consumption. As an example, R2=7.5 k$\Omega$. A second terminal of the second resistor 108 is coupled, preferably directly connected, to the first terminal of a third resistor 110 having a resistance R3. As an example, R3=37.51 k$\Omega$. A second terminal of the third resistor 110 is coupled, preferably directly connected, to the reference supply voltage node Vss. The second resistor 108 and third resistor 110 form a second resistive voltage divider circuit having a first voltage tap (Vhigh) at the terminal of the resistor 108 and a second voltage tap (Vlow) at the resistor 110. The detector can be designed such that the comparator reference voltages (Vlow, Vhigh) are not the same as other supply voltages exposed in the package. In order to detect a faulty electrical trace 50 (for example >500$\Omega$), then Vhigh=0.9V.

A first comparator circuit 120 has a non-inverting input coupled, preferably directly connected, to the first pad 102 to receive the voltage Vpad1 and an inverting input coupled, preferably directly connected, to a node at the connection of the second current source I2 to the first terminal of the second resistor 108 to receive the voltage Vhigh. Thus, with the optical element 40 properly in place, an operation using the example current and resistance values noted above would result in the inverting input voltage of Vhigh=0.9V and the non-inverting input voltage of Vpad1=0.85V; and in this condition (with Vpad1<Vhigh) the logic signal H output by the first comparator circuit 120 will be logic low.

A second comparator circuit 122 has an inverting input coupled, preferably directly connected, to the second pad 104 to receive the voltage Vpad2 and a non-inverting input coupled, preferably directly connected, to the first terminal of the third resistor 110 to receive the voltage Vlow. Thus, with the optical element 40 properly in place, an operation using the example current and resistance values noted above would result in the non-inverting input voltage Vlow=0.75V and the inverting input voltage Vpad2=0.8V; and in this condition (with Vlow<Vpad2) the logic signal L output by the second comparator circuit 122 will be logic low.

The logic signal H output by the first comparator circuit 120 and the logic signal L output by the second comparator circuit 122 are applied to the inputs of a combinational logic circuit formed, for example, by a logic NOR gate 124. With the optical element 40 properly in place, and the logic signal H output by the first comparator circuit 120 and the logic signal L output by the second comparator circuit 122 both at logic low, the logic signal D output from the logic NOR gate 124 will be at logic high.

The logic signal D output from the logic NOR gate 124 is applied to a first input of a combinational logic circuit formed, for example, by a logic AND gate 126. A second input of the logic AND gate 126 receives a sense enable signal S_EN. The sense enable signal S_EN is logic high whenever the control integrated circuit 22 is enabling sensing of lens displacement. The output of the logic AND gate 126 generates a laser enable signal L_EN whose logic state controls enabling of the driver circuit of the control integrated circuit 22 for driving operation of the light source 20 to provide light 26. With the optical element 40 properly in place, and the logic signal D output from the logic NOR gate 124 and the logic signal L_EN output from the logic AND gate 126 both at logic high, the laser enable signal L_EN is also logic high and this logic state will enable operation of the driver circuit for the light source 20.

In the scenario where the optical element 40 is not properly in place, one or the other or both of the following will occur: a) the non-inverting input voltage Vpad1 will rise to above the inverting input voltage Vhigh (Vpad1>Vhigh) and/or b) the inverting input voltage Vpad2 will fall to below the non-inverting input voltage Vlow (Vpad2<Vlow). In response thereto, the logic signal H (output by the first comparator circuit 120) and/or the logic signal L (output by the second comparator circuit 122) will switch to logic high causing both the logic signal D (output from the logic NOR gate 124) and the logic signal L_EN (output from the logic AND gate 126) to switch to logic low. The driver circuit for the light source 20 will then be disabled.

The sensing circuit 100 provides an additional safety feature. In the event that the first pad 102 is mistakenly, inadvertently or accidentally coupled to an external positive voltage (see reference 130), the non-inverting input voltage Vpad1 will rise to a level which exceeds the inverting input voltage Vhigh (Vpad1>Vhigh) and in response thereto the logic state of the logic signal H (output by the first comparator circuit 120) will change to logic high causing the logic signals D and L_EN (output from the logic NOR gate 124 and logic AND gate 126, respectively) to switch to logic low and disable the driver circuit for the light source 20. Similarly, in the event that the second pad 104 is mistakenly, inadvertently or accidentally coupled to an external reference voltage (see reference 132), the inverting input voltage Vpad2 will fall to a level which is less than the non-inverting input voltage Vlow (Vpad2<Vlow) and in response thereto the logic state of the logic signal L (output by the second comparator circuit 122) will change to logic high causing the logic signals D and L_EN (output from the logic NOR gate 124 and logic AND gate 126, respectively) to also switch to logic low and disable the driver circuit for the light source 20.

It will be noted for the circuit of FIG. 4 that a greater accuracy for detection can be accomplished by increasing current levels. This is done at the expense of increased power consumption, and thus the circuit designer should properly balance with the needs of accuracy and reduced power consumption in selecting current and resistance values for the circuit.

It will further be noted for the circuit of FIG. 4 that it could be designed to support calibration in order to improve accuracy. For example, the magnitude of the current output from the current source I2 could be variable. Additionally, and or alternatively, the resistances of the resistors R2 and R3 could variable. Tuning of the variable current source and resistance values can be performed at circuit test (either wafer test or final test as understood by those skilled in the art).

Figure 5:
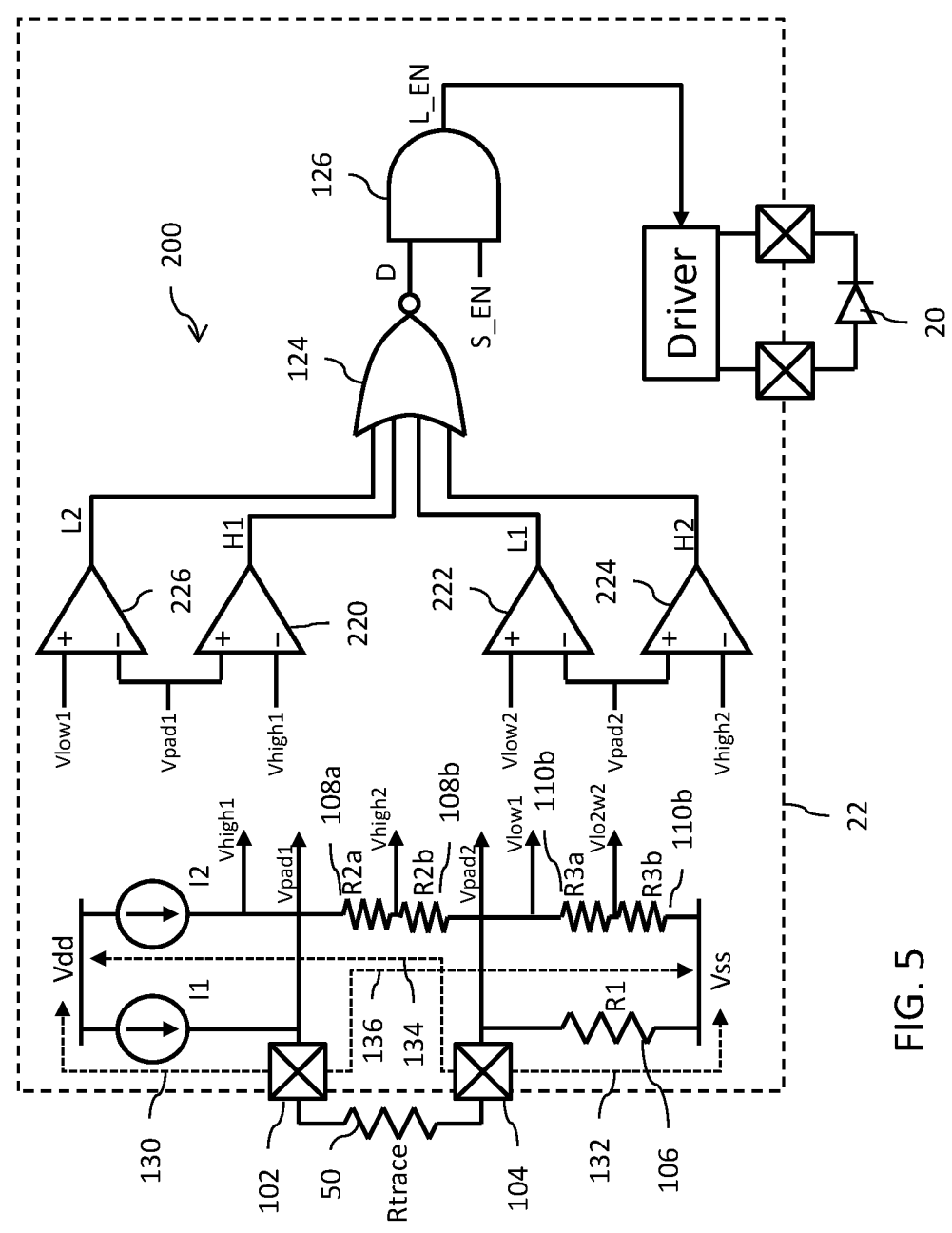
FIG. 5 is a circuit diagram for the lens displacement detection circuit.

Reference is now made to FIG. 5 which shows a circuit diagram for a sensing circuit 200 that is included within the control integrated circuit 22. The optical element 40 includes the electrical trace 50 which is represented here by a resistance Rtrace. As an example, Rtrace=250Ω. A first end of the electrical trace 50 is coupled to a first pad 102 of the control integrated circuit 22 through an electrical connection provided by the integrated electrical connection network 14 and the holder 42. A second end of the electrical trace 50 is coupled to a second pad 104 of the control integrated circuit 22 through an electrical connection provided by the integrated electrical connection network 14 and the holder 42. A first current source I1 powered from a positive supply voltage node Vdd sources a current to the first pad 102. The current from the first current source I1 may, for example, have a value of 200 μA. A first resistor 106 having a resistance R1 has a first terminal coupled, preferably directly connected, to the second pad 104 and a second terminal coupled, preferably directly connected, to a reference supply voltage node Vss (for example, ground). As an example, R1=4 kΩ. The electrical trace 50 and the first resistor 106 form a first resistive voltage divider circuit. When the optical element 40 is properly in place within the holder 42, the current sourced from the first current source I1 flows through the electrical trace 50 and the first resistor 106.

A second current source I2 powered from the positive supply voltage node Vdd sources a current to the first terminal of a second resistor 108a having a resistance R2a. The current from the second current source I2 may, for example, have a value of 20 μA. As an example, R2a=2.5 kΩ. A second terminal of the second resistor 108a is coupled, preferably directly connected, to the first terminal of a third resistor 108b having a resistance R2b. As an example, R2b=2.0 kΩ. A second terminal of the third resistor 108b is coupled, preferably directly connected, to the first terminal of a fourth resistor 110a having a resistance R3a. As an example, R3a=3.0 kΩ. A second terminal of the fourth resistor 110a is coupled, preferably directly connected, to the first terminal of a fifth resistor 110b having a resistance R3b. As an example, R3b=37.5 kΩ. A second terminal of the fifth resistor 110b is coupled, preferably directly connected, to the reference supply voltage node Vss. The resistors 108a, 108b, 110a and 110b form a second resistive voltage divider circuit.

A first comparator circuit 220 has a non-inverting input coupled, preferably directly connected, to the first pad 102 to receive the voltage Vpad1 and an inverting input coupled, preferably directly connected, to a tap node of the second resistive voltage divider (at the connection of the second current source I2 to the first terminal of the second resistor 108a) to receive the voltage Vhigh1. Thus, with the optical element 40 properly in place, an operation using the example current and resistance values noted above would result in the inverting input voltage Vhigh1=0.9V and the non-inverting input voltage Vpad1=0.85V; and in this condition (Vpad1<Vhigh1) the logic signal H1 output by the first comparator circuit 220 will be logic low.

A second comparator circuit 222 has an inverting input coupled, preferably directly connected, to the second pad 104 to receive the voltage Vpad2 and a non-inverting input coupled, preferably directly connected, to a tap node in the second resistive voltage divider (at the connection of the second terminal of the fourth resistor 110a and the first terminal of the fifth resistor 110b) to receive the voltage Vlow2. Thus, with the optical element 40 properly in place, an operation using the example current and resistance values noted above would result in the non-inverting input voltage Vlow2=0.75V and the inverting input voltage Vpad2=0.8V; and in this condition (Vlow2<Vpad2) the logic signal L1 output by the second comparator circuit 222 will be logic low.

A third comparator circuit 224 has a non-inverting input coupled, preferably directly connected, to the second pad 104 to receive the voltage Vpad2 and an inverting input coupled, preferably directly connected, to a tap node in the second resistive voltage divider (at the connection of the second terminal of the second resistor 108a and the first terminal of the third resistor 108b) to receive the voltage Vhigh2. Thus, with the optical element 40 properly in place, an operation using the example current and resistance values noted above would result in the inverting input voltage Vhigh2=0.85V and the non-inverting input voltage Vpad2=0.8V; and in this condition (Vpad2<Vhigh2) the logic signal H2 output by the third comparator circuit 224 will be logic low.

A fourth comparator circuit 226 has an inverting input coupled, preferably directly connected, to the first pad 102 to receive the voltage Vpad1 and a non-inverting input coupled, preferably directly connected, to a tap node of the second resistive voltage divider (at the connection of the second terminal of the third resistor 108b and the first terminal of the fourth resistor 110a) to receive the voltage Vlow1. Thus, with the optical element 40 properly in place, an operation using the example current and resistance values noted above would result in the non-inverting input voltage Vlow1=0.81V and the inverting input voltage Vpad1=0.85V; and in this condition (Vlow1<Vpad1) the logic signal L2 output by the fourth comparator circuit 226 will be logic low.

The logic signals H1, H2 output by the first and third comparator circuits 220, 224 and the logic signals L1, L2 output by the second and fourth comparator circuit 222, 226 are applied to the inputs of a combinational logic circuit formed, for example, by a logic NOR gate 124. With the optical element 40 properly in place, and the logic signals H1, H2 output by the first and third comparator circuits 220, 224 and the logic signals L1, L2 output by the second and fourth comparator circuits 222, 226 all at logic low, the logic signal D output from the logic NOR gate 124 will be at logic high.

The logic signal D output from the logic NOR gate 124 is applied to a first input of a combinational logic circuit formed, for example, by a logic AND gate 126. A second input of the logic AND gate 126 receives a sense enable signal S_EN. The sense enable signal S_EN is logic high whenever the control integrated circuit 22 is enabling sensing of lens displacement. The output of the logic AND gate 126 generates a laser enable signal L_EN whose logic state controls enabling of the driver circuit of the control integrated circuit 22 for driving operation of the light source 20 to provide light 26. With the optical element 40 properly in place, and the logic signal D output from the logic NOR gate 124 and the logic signal L_EN output from the logic AND gate 126 both at logic high, the laser enable signal L_EN is also logic high and this logic state will enable operation of the driver circuit for the light source 20.

In the scenario where the optical element 40 is not properly in place, one or the other or both of the following will occur: a) the non-inverting input voltage Vpad1 will rise to above the inverting input voltage Vhigh1 (Vpad1>Vhigh1) and/or b) the inverting input voltage Vpad2 will fall to below the non-inverting input voltage Vlow2 (Vpad2<Vlow2). In response thereto, the logic signal H1 (output by the first comparator circuit 220) and/or the logic signal L1 (output by the second comparator circuit 222) will switch to logic high causing both the logic signal D (output from the logic NOR gate 124) and the logic signal L_EN (output from the logic AND gate 126) to switch to logic low. The driver circuit for the light source 20 will then be disabled.

As a result of problem with the optical element, it is also possible for: c) the inverting input voltage Vpad1 to fall below the non-inverting input voltage Vlow1 (Vpad1<Vlow1) and/or the non-inverting input voltage Vpad2 to rise above the inverting input voltage Vhigh2 (Vpad2>Vhigh2). In response thereto, the logic signal H2 (output by the third comparator circuit 224) and/or the logic signal L2 (output by the fourth comparator circuit 226) will switch to logic high causing both the logic signal D (output from the logic NOR gate 124) and the logic signal L_EN (output from the logic AND gate 126) to switch to logic low. The driver circuit for the light source 20 will then be disabled.

The sensing circuit 200 provides an additional safety feature. In the event that the first pad 102 is mistakenly, inadvertently or accidentally coupled to an external positive voltage (see reference 130), the non-inverting input voltage Vpad1 will rise to a level which exceeds the inverting input voltage Vhigh1 and in response thereto (Vpad1>Vhigh1) the logic state of the logic signal H1 (output by the first comparator circuit 220) will change to logic high causing the logic signals D and L_EN (output from the logic NOR gate 124 and logic AND gate 126, respectively) to switch to logic low and disable the driver circuit for the light source 20.

Similarly, in the event that the second pad 104 is mistakenly, inadvertently or accidentally coupled to an external reference voltage (see reference 132), the inverting input voltage Vpad2 will fall to a level which is less than the non-inverting input voltage Vlow2 and in response thereto (Vpad2<Vlow2) the logic state of the logic signal L1 (output by the second comparator circuit 222) will change to logic high causing the logic signals D and L_EN (output from the logic NOR gate 124 and logic AND gate 126, respectively) to switch to logic low and disable the driver circuit for the light source 20.

Further to providing the additional safety feature, in the event that the second pad 104 is mistakenly, inadvertently or accidentally coupled to the external positive voltage (see reference 134), the non-inverting input voltage Vpad2 will rise to a level which exceeds the inverting input voltage Vhigh2 and in response thereto (Vpad2>Vhigh2) the logic state of the logic signal H2 (output by the third comparator circuit 224) will change to logic high causing the logic signals D and L_EN (output from the logic NOR gate 124 and logic AND gate 126, respectively) to switch to logic low and disable the driver circuit for the light source 20.

Similarly, in the event that the first pad 102 is mistakenly, inadvertently or accidentally coupled to the external reference voltage (see reference 136), the inverting input voltage Vpad1 will fall to a level which is less than the non-inverting input voltage Vlow1 and in response thereto (Vpad1<Vlow1) the logic state of the logic signal L2 (output by the fourth comparator circuit 226) will change to logic high causing the logic signal D and L_EN (output from the logic NOR gate 124 and logic AND gate 126, respectively) to also switch to logic low and disable the driver circuit for the light source 20.

It will further be noted for the circuit of FIG. 5 that it could be designed to support calibration in order to improve accuracy. For example, the magnitude of the current output from the current source I2 could be variable. Additionally, and or alternatively, the resistances of the resistors R2a, R2b, R3a and R3b could variable. Tuning of the variable current source and resistance values can be performed at circuit test (either wafer test or final test as understood by those skilled in the art).

Figure 6:
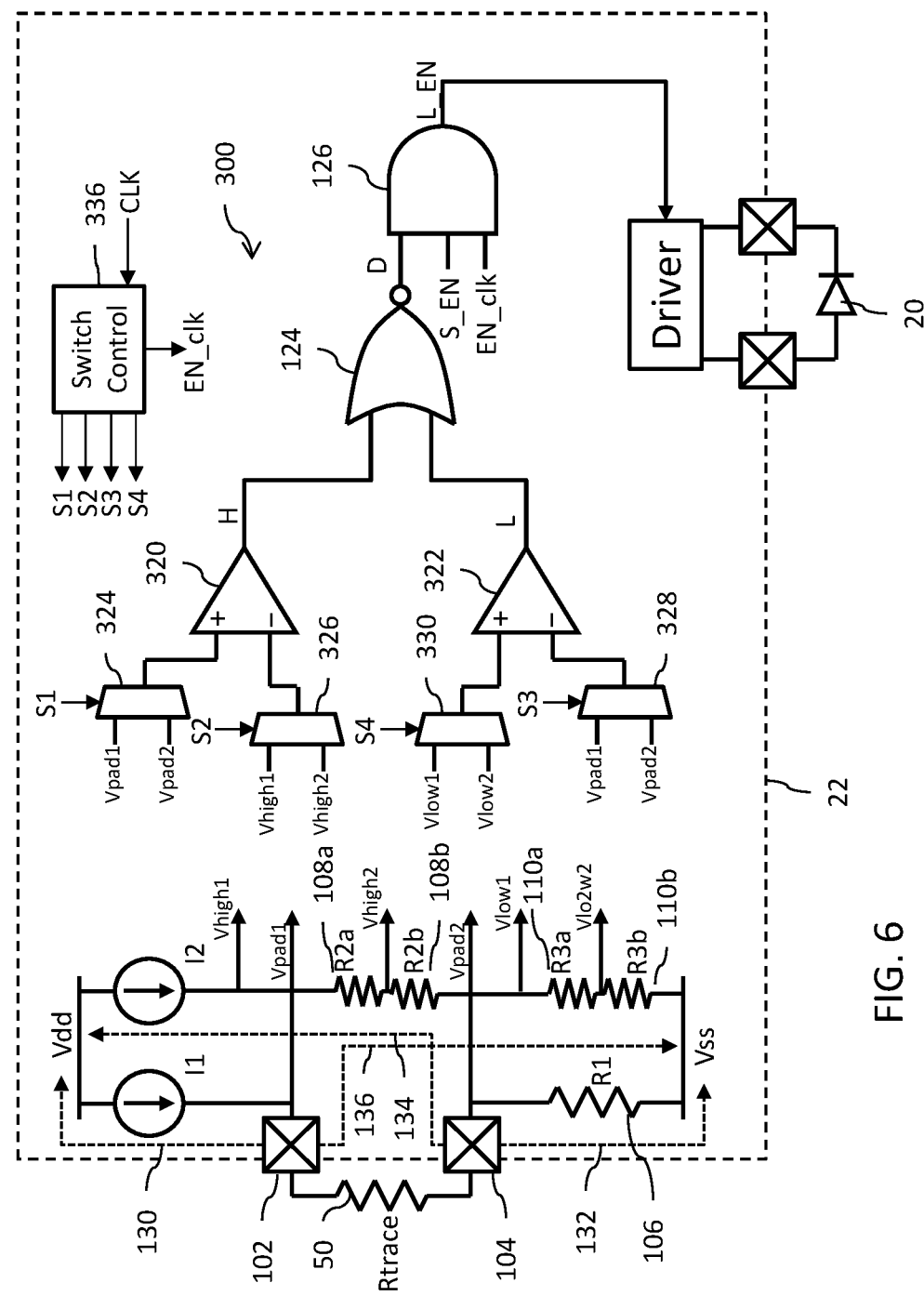
FIG. 6 is a circuit diagram for the lens displacement detection circuit.

A disadvantage of the FIG. 5 circuit 200 is the additional circuit area occupied by the comparators 224 and 226. This disadvantage is addressed by the sensing circuit 300 (included within the control integrated circuit 22) that is shown in FIG. 6.

The optical element 40 includes the electrical trace 50 which is represented here by a resistance Rtrace. As an example, Rtrace=250Ω. A first end of the electrical trace 50 is coupled to a first pad 102 of the control integrated circuit 22 through an electrical connection provided by the integrated electrical connection network 14 and the holder 42. A second end of the electrical trace 50 is coupled to a second pad 104 of the control integrated circuit 22 through an electrical connection provided by the integrated electrical connection network 14 and the holder 42. A first current source I1 powered from a positive supply voltage node Vdd sources a current to the first pad 102. The current from the first current source I1 may, for example, have a value of 200 μA. A first resistor 106 having a resistance R1 has a first terminal coupled, preferably directly connected, to the second pad 104 and a second terminal coupled, preferably directly connected, to a reference supply voltage node Vss (for example, ground). As an example, R1=4 kΩ. The electrical trace 50 and the first resistor 106 form a first resistive voltage divider circuit. When the optical element 40 is properly in place within the holder 42, the current sourced from the first current source I1 flows through the electrical trace 50 and the first resistor 106.

A second current source I2 powered from the positive supply voltage node Vdd sources a current to the first terminal of a second resistor 108a having a resistance R2a. The current from the second current source I2 may, for example, have a value of 20 μA. As an example, R2a=2.5 kΩ. A second terminal of the second resistor 108a is coupled, preferably directly connected, to the first terminal of a third resistor 108b having a resistance R2b. As an example, R2b=2.0 kΩ. A second terminal of the third resistor 108b is coupled, preferably directly connected, to the first terminal of a fourth resistor 110a having a resistance R3a. As an example, R3a=3.0 kΩ. A second terminal of the fourth resistor 110a is coupled, preferably directly connected, to the first terminal of a fifth resistor 110b having a resistance R3b. As an example, R3b=37.5 kΩ. A second terminal of the fifth resistor 110b is coupled, preferably directly connected, to the reference supply voltage node Vss. The resistors 108a, 108b, 110a and 110b form a second resistive voltage divider circuit.

A first comparator circuit 320 has a non-inverting input coupled, preferably directly connected, to the output of a switch multiplexer circuit 324 having a first input coupled, preferably directly connected, to the first pad 102 to receive the voltage Vpad1 and a second input coupled, preferably directly connected, to the second pad 104 to receive the voltage Vpad2. A first control signal S1 generated by a switch control circuit 336 controls the switching operation of the switch multiplexer circuit 324 for selecting between the voltages at the first and second pads 102, 104 for application to the non-inverting input of the first comparator circuit 320. The inverting input of the first comparator circuit 320 is coupled, preferably directly connected, to the output of a switch multiplexer circuit 326 having a first input coupled, preferably directly connected, to receive the voltage Vhigh 1 from a tap of the second resistive voltage divider (at the connection of the current source I2 to the first terminal of the second resistor 108a) and the voltage Vhigh 2 from a tap of the second resistive voltage divider (at the connection of the second terminal of the second resistor 108a and the first terminal of the third resistor 108b). A second control signal S2 generated by the switch control circuit 336 controls the switching operation of the switch multiplexer circuit 326 for selecting between the voltages Vhigh1 and Vhigh2.

A second comparator circuit 322 has an inverting input coupled, preferably directly connected, to the output of a switch multiplexer circuit 328 having a first input coupled, preferably directly connected, to the first pad 102 to receive the voltage Vpad1 and a second input coupled, preferably directly connected, to the second pad 104 to receive the voltage Vpad2. A third control signal S3 generated by the switch control circuit 336 controls the switching operation of the switch multiplexer circuit 328 for selecting between the voltages at the first and second pads 102, 104 for application to the inverting input of the second comparator circuit 322. The non-inverting input of the second comparator circuit 322 is coupled, preferably directly connected, to a switch multiplexer circuit 330 having a first input coupled, preferably directly connected, to receive the voltage Vlow 1 from a tap of the second resistive voltage divider (at the connection of the second terminal of the third resistor 108b to the first terminal of the fourth resistor 110a) and the voltage Vlow 2 from a tap of the second resistive voltage divider (at the connection of the second terminal of the fourth resistor 110a and the first terminal of the fifth resistor 110b). A fourth control signal S4 generated by the switch control circuit 336 controls the switching operation of the switch multiplexer circuit 326 for selecting between the voltages Vlow1 and Vlow2.

The logic signal H output by the first comparator circuit 320 and the logic signal L output by the second comparator circuit 322 are applied to the inputs of a combinational logic circuit formed, for example, by a logic NOR gate 124. The logic signal D output from the logic NOR gate 124 is applied to a first input of a combinational logic circuit formed, for example, by a logic AND gate 126. A second input of the logic AND gate 126 receives a sense enable signal S_EN. The sense enable signal S_EN is logic high whenever the control integrated circuit 22 is enabling sensing of lens displacement. The output of the logic AND gate 126 generates a laser enable signal L_EN whose logic state controls enabling of the driver circuit of the control integrated circuit 22 for driving operation of the light source 20 to provide light 26.

With the optical element 40 properly in place, an operation using the example current and resistance values noted above would result in the following: Vpad1=0.85V, Vpad2=0.8V, Vhigh1=0.9, Vhigh2=0.85V, Vlow1=0.81V and Vlow2=0.75V.

So, with the first control signal S1 in a logic state for selecting the voltage Vpad1 at the first pad 102 and the second control signal S2 in a logic state for selecting the voltage Vhigh1, with the optical element 40 properly in place, Vpad1<Vhigh1 and the logic signal H output by the first comparator circuit 320 will be logic low. With the third control signal S3 in a logic state for selecting the voltage Vlow2 and the fourth control signal S4 in a logic state for selecting the voltage Vpad2 at the second pad 104, with the optical element 40 properly in place, Vpad2>Vlow2 and the logic signal L output by the first comparator circuit 322 will be logic low. When the signals H and L are both logic low, the logic signal output from the logic NOR gate 124 will be logic high and the operation of the driver circuit for the light source 20 will be enabled (as long as the laser enable signal L_EN is also logic high).

Similarly, with the first control signal S1 in a logic state for selecting the voltage Vpad2 at the second pad 104 and the second control signal S2 in a logic state for selecting the voltage Vhigh2, with the optical element 40 properly in place, Vpad2<Vhigh2 and the logic signal H output by the first comparator circuit 320 will be logic low. With the third control signal S3 in a logic state for selecting the voltage Vlow1 and the fourth control signal S4 in a logic state for selecting the voltage Vpad1 at the first pad 102, with the optical element 40 properly in place, Vpad1>Vlow1 and the logic signal L output by the first comparator circuit 322 will be logic low. When the signals H and L are both logic low, the logic signal output from the logic NOR gate 124 will be logic high and the operation of the driver circuit for the light source 20 will be enabled (as long as the laser enable signal L_EN is also logic high).

In the scenario where the optical element 40 is not properly in place, one or the other or both of the following will occur: a) the voltage Vpad1 will rise to above the voltage Vhigh1 (Vpad1>Vhigh1) and/or b) the voltage Vpad2 will fall to below the voltage Vlow2 (Vpad2<Vlow2). In response thereto, the logic signal H (output by the first comparator circuit 320) and/or the logic signal L (output by the second comparator circuit 322) will switch to logic high causing both the logic signal D (output from the logic NOR gate 124) and the logic signal L_EN (output from the logic AND gate 126) to switch to logic low. The driver circuit for the light source 20 will then be disabled. These conditions can be tested for through the proper selection of the logic values for the control signals S1, S2, S3 and S4.

As a result of problem with the optical element, it is also possible for: c) the voltage Vpad1 to fall below the voltage Vlow1 (Vpad1<Vlow1) and/or the voltage Vpad2 to rise above the voltage Vhigh2 (Vpad2>Vhigh2). In response thereto, the logic signal H (output by the first comparator circuit 320) and/or the logic signal L (output by the second comparator circuit 322) will switch to logic high causing both the logic signal D (output from the logic NOR gate 124) and the logic signal L_EN (output from the logic AND gate 126) to switch to logic low. The driver circuit for the light source 20 will then be disabled. These conditions can also be tested for through the proper selection of the logic values for the control signals S1, S2, S3 and S4.

Thus, the use of the multiplexer selections permits a window comparison to be made with respect to the voltages on the pads 102 and 104. For example, the voltage Vpad1 can be compared to a voltage window delimited by the voltages Vhigh1 and Vlow1. Likewise, the voltage Vpad2 can be compared to a voltage window delimited by the voltages Vhigh2 and Vlow2.

The sensing circuit 300 provides an additional safety feature. In the event that the first pad 102 is mistakenly, inadvertently or accidentally coupled to an external positive voltage (see reference 130), this can be detected by placing the first control signal S1 in the logic state for selecting the voltage at the first pad 102 and placing the second control signal S2 in the logic state for selecting the voltage Vhigh1. If Vpad1>Vhigh1, then the logic state of the logic signal H (output by the first comparator circuit 320) will change to logic high causing the logic signals D and L_EN (output from the logic NOR gate 124 and logic AND gate 126, respectively) to switch to logic low and disable the driver circuit for the light source 20.

Similarly, in the event that the second pad 104 is mistakenly, inadvertently or accidentally coupled to an external reference voltage (see reference 132), this can be detected by placing the third control signal S3 in the logic state for selecting the voltage Vlow2 and placing the fourth control signal S4 in the logic state for selecting the voltage at the second pad 104. If Vpad2<Vlow2, then the logic state of the logic signal H (output by the first comparator circuit 320) will change to logic high causing the logic signals D and L_EN (output from the logic NOR gate 124 and logic AND gate 126, respectively) to switch to logic low and disable the driver circuit for the light source 20.

Further to providing the additional safety feature, in the event that the second pad 104 is mistakenly, inadvertently or accidentally coupled to the external positive voltage (see reference 134), this can be detected by placing the first control signal S1 in the logic state for selecting the voltage at the second pad 104 and placing the second control signal S2 in the logic state for selecting the voltage Vhigh2. If Vpad2>Vhigh2, then the logic state of the logic signal H (output by the first comparator circuit 320) will change to logic high causing the logic signals D and L_EN (output from the logic NOR gate 124 and logic AND gate 126, respectively) to switch to logic low and disable the driver circuit for the light source 20.

Similarly, in the event that the first pad 102 is mistakenly, inadvertently or accidentally coupled to the external reference voltage (see reference 136), this can be detected by placing the third control signal S3 in the logic state for selecting the voltage Vlow1 and placing the fourth control signal S4 in the logic state for selecting the voltage at the first pad 102. If Vpad1<Vlow1, then the logic state of the logic signal H (output by the first comparator circuit 320) will change to logic high causing the logic signals D and L_EN (output from the logic NOR gate 124 and logic AND gate 126, respectively) to switch to logic low and disable the driver circuit for the light source 20.

The switch control circuit 336 may be implemented using any suitable digital control circuit. As an example, a finite state machine (FSM) could be used for the switch control circuit 336. The digital control circuit may be clocked by a clock signal CLK that controls the rate, sequential order and timing at which the logic states of the control signals S1, S2, S3, S4 switch logic states. A suitable watchdog circuit can be used to monitor the clock signal. In the event that the clock signal becomes inactive, the watchdog circuit of the switch control circuit 336 may change the logic state of an enable signal EN_clk to a logic low state. That enable signal EN_clk is also applied to the logic AND gate 126 and if in the logic low state the driver circuit for the light source 20 would be disabled. With respect to sequential order, control is exercised by the control circuit 336 to ensure that there are no glitches of false comparator triggers. As an example, with respect to the comparator 320, second control signal S2 may initially select the voltage Vhigh1, and the first control signal S1 will sequentially select the voltages Vpad1 and Vpad2 for comparison to the voltage Vhigh1. Next, the second control signal S2 will select the voltage Vpad2, and then perform the same comparisons. This process will be repeated with respect to the operation of the second comparator 322.

It will further be noted for the circuit of FIG. 6 that it could be designed to support calibration in order to improve accuracy. For example, the magnitude of the current output from the current source I2 could be variable. Additionally, and or alternatively, the resistances of the resistors R2 and R3 could variable. Tuning of the variable current source and resistance values can be performed at circuit test (either wafer test or final test as understood by those skilled in the art).

Figure 7:
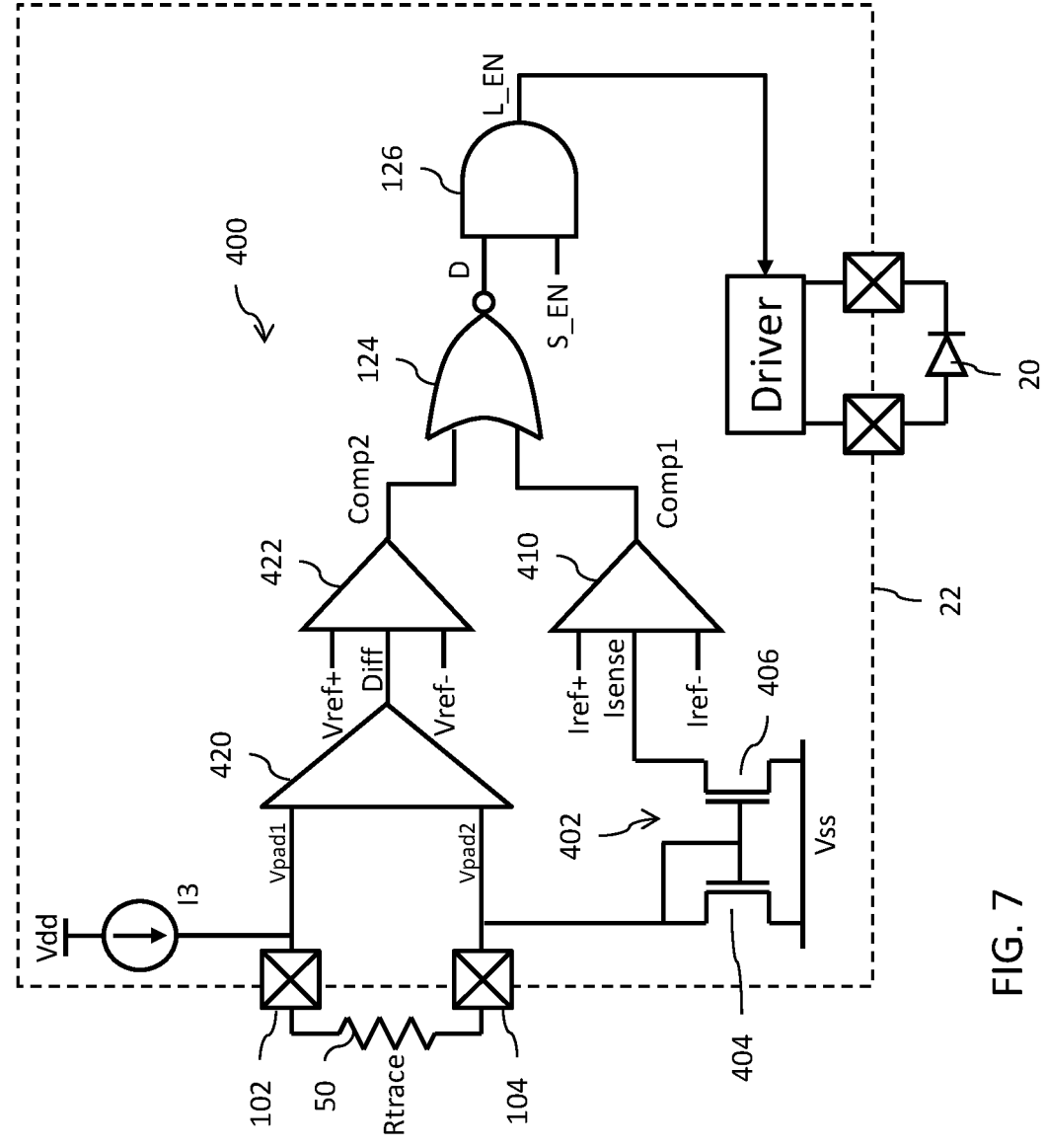
FIG. 7 is a circuit diagram for the lens displacement detection circuit.

Reference is now made to FIG. 7 which shows a circuit diagram for a sensing circuit 400 that is included within the control integrated circuit 22. The optical element 40 includes the electrical trace 50 which is represented here by a resistance Rtrace. As an example, Rtrace=250Ω. A first end of the electrical trace 50 is coupled to a first pad 102 of the control integrated circuit 22 through an electrical connection provided by the integrated electrical connection network 14 and the holder 42. A second end of the electrical trace 50 is coupled to a second pad 104 of the control integrated circuit 22 through an electrical connection provided by the integrated electrical connection network 14 and the holder 42. A current source 13 powered from a positive supply voltage node Vdd sources a current to the first pad 102.

A current mirror circuit 402 is coupled, preferably directly connected, to the second pad 104. The current mirror circuit 402 is constructed by a pair of n-channel field effect transistors (nMOS) 404 and 406 where a drain and gate of the transistor 404 are coupled, preferably directly connected, to the second pad 104, a gate of the transistor 406 is coupled, preferably directly connected, to the gate of transistor 404, and the sources of transistors 404 and 406 are both coupled, preferably directly connected, to a reference supply voltage node Vss (for example, ground). The current mirror circuit 402 functions to mirror current flowing through the electrical trace 50 to output a sense current Isense at the drain of transistor 406. A current comparator circuit 410 has a first input coupled to receive the sense current Isense from the drain of transistor 406 and second and third inputs coupled to receive fixed reference currents Iref+ and Iref− (for example, generated using a bandgap circuit). The current comparator circuit 410 outputs a first digital signal Comp1 whose logic state is indicative a result of the comparison on the current Isense to the currents Iref+ and Iref−. In this embodiment, the current comparator circuit 410 performs a window comparison operation whereby the sense current Isense is compared to the high reference current Iref+ and the low reference current Iref− and the logic state of the first digital signal Comp1 is indicative of whether the sensed current Isense is inside or outside of the window defined by the currents Iref+ and Iref−. For example, the first digital signal Comp1 may have a logic low state when the sensed current Isense is within the current window, and otherwise have a logic high state.

A differential amplifier circuit 420 has a first input coupled, preferably directly connected, to the first pad 102 to receive the voltage Vpad1 and a second input coupled, preferably directly connected, to the second pad 104 to receive the voltage Vpad2. The differential amplifier circuit 420 outputs an analog signal Diff that is the difference between the voltages Vpad1 and Vpad1. A comparator circuit 422 has a first input coupled, preferably directly connected, to receive the analog difference voltage Diff and second and third inputs coupled, preferably directly connected, to receive fixed reference voltages Vref+ and Vref− (for example, generated using a bandgap circuit). The comparator circuit 422 outputs a second digital signal Comp2 whose logic state is indicative a result of the comparison of the voltage Diff to the reference voltages Vref+ and Vref−. In this embodiment, the voltage comparator circuit 422 performs a window comparison operation whereby the voltage Diff is compared to the high reference voltage Vref+ and the low reference voltage Vref− and the logic state of the second digital signal Comp2 is indicative of whether the sensed difference Diff is inside or outside of the window defined by the voltages Vref+ and Vref−. For example, the second digital signal Comp2 may have a logic low state when the sensed difference Diff is within the voltage window, and otherwise have a logic high state.

The logic signal Comp1 output by the comparator circuit 410 and the logic signal Comp2 output by the comparator circuit 422 are applied to the inputs of a combinational logic circuit formed, for example, by a logic NOR gate 124. With the optical element 40 properly in place, and the logic signal Comp1 output by the first comparator circuit 410 and the logic signal Comp2 output by the comparator circuit 422 both at logic low, the logic signal D output from the logic NOR gate 124 will be at logic high.

The logic signal D output from the logic NOR gate 124 is applied to a first input of a combinational logic circuit formed, for example, by a logic AND gate 126. A second input of the logic AND gate 126 receives a sense enable signal S_EN. The sense enable signal S_EN is logic high whenever the control integrated circuit 22 is enabling sensing of lens displacement. The output of the logic AND gate 126 generates a laser enable signal L_EN whose logic state controls enabling of the driver circuit of the control integrated circuit 22 for driving operation of the light source 20 to provide light 26. With the optical element 40 properly in place, and the logic signal D output from the logic NOR gate 124 and the logic signal L_EN output from the logic AND gate 126 both at logic high, the laser enable signal L_EN is also logic high and this logic state will enable operation of the driver circuit for the light source 20.

In the scenario where the optical element 40 is not properly in place, one or the other or both of the following will occur: a) the sensed difference Diff will fall outside of the voltage window and/or b) the sensed current Isense will fall outside of the current window. In response thereto, the logic signal Comp1 (output by the comparator circuit 410) and/or the logic signal Comp2 (output by the comparator circuit 422) will switch to logic high causing both the logic signal D (output from the logic NOR gate 124) and the logic signal L_EN (output from the logic AND gate 126) to switch to logic low. The driver circuit for the light source 20 will then be disabled.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:

1. An optical device, comprising:
an optical element positioned over a laser light source;
a driver circuit configured to drive said laser light source in response to an enable signal;
a conductive trace provided at said optical element, where the conductive trace is coupled between a first pad and a second pad; and
a sensing circuit comprising:
a first current source configured to source a first current to a first resistive divider circuit which includes said conductive trace;
a second current source configured to source a second current to a second resistive divider circuit configured to output a high reference voltage and a low reference voltage;
a first comparator circuit having a first input coupled to receive a voltage at the first pad and a second input coupled to receive the high reference voltage;
a second comparator circuit having a first input coupled to receive a voltage at the second pad and a second input coupled to receive the low reference voltage; and
a combinational logic circuit configured to logically combine digital signals output from the first and second comparator circuits to generate said enable signal.

2. The optical device of claim 1, wherein the first resistive divider circuit comprises a series connection of a trace resistance provided by said conductive trace and a first resistance coupled between the second pad and a reference supply node.

3. The optical device of claim 1, wherein the second resistive divider circuit comprises a series connection of a plurality of resistances, with the high reference voltage being output from a first tap of the second resistive divider circuit and the low reference voltage being output from a second tap of the second resistive divider circuit.

4. The optical device of claim 3, wherein the plurality of resistances comprises a second resistance and a third resistance coupled in series, and wherein a first tap is at a terminal of the second resistance and the second tap is a tap at a terminal of the third resistance.

5. The optical device of claim 1, wherein the sensing circuit further comprises:
   a third comparator circuit having a first input coupled to receive a voltage at the second pad and a second input coupled to receive a further high reference voltage; and
   a fourth comparator circuit having a first input coupled to receive a voltage at the first pad and a second input coupled to receive a further low reference voltage; and
   wherein said combinational logic circuit is configured to logically combine digital signals output from the first, second, third and fourth comparator circuits to generate said enable signal.

6. The optical device of claim 5, wherein the second resistive divider circuit comprises a series connection of a plurality of resistances, with the high reference voltage being output from a first tap of the second resistive divider circuit, the further high reference voltage being output from a second tap of the second resistive divider circuit, the low reference voltage being output from a third tap of the second resistive divider circuit and the further low reference voltage being output from a fourth tap of the second resistive divider circuit.

7. The optical device of claim 6, wherein the plurality of resistances comprise a second resistance, a third resistance, a fourth resistance and a fifth resistance coupled in series, and wherein the first tap is at a terminal of the second resistance, the second tap is a tap at a terminal of the third resistance, the third tap is at a terminal of the fourth resistance, and the fourth tap is at a terminal of the fifth resistance.

8. The optical device of claim 1, wherein the sensing circuit further comprises:
   a first switch multiplexer circuit having a first input configured to receive the voltage at the first pad, a second input configured to receive the voltage at the second pad and an output coupled to the first input of the first comparator circuit;
   wherein switching between selection of the voltages at the first and second pads for output to the first input of the first comparator circuit is controlled by a first control signal; and
   a second switch multiplexer circuit having a first input configured to receive the voltage at the first pad, a second input configured to receive the voltage at the second pad and an output coupled to the first input of the second comparator circuit;
   wherein switching between selection of the voltages at the first and second pads for output to the first input of the second comparator circuit is controlled by a second control signal.

9. The optical device of claim 8, wherein the first and second control signals are generated by a control circuit in response to a clock signal.

10. The optical device of claim 9, wherein said control circuit generates a further enable signal in response to said clock signal and wherein said combinational logic circuit is configured to logically combine digital signals output from the first and second comparator circuits with said further enable signal to generate said enable signal.

11. The optical device of claim 8, wherein the second resistive divider circuit is configured to further output a further high reference voltage and a further low reference voltage, and wherein the sensing circuit further comprises:
   a third switch multiplexer circuit having a first input configured to receive the high reference voltage, a second input configured to receive the further high reference voltage and an output coupled to the second input of the first comparator circuit;
   wherein switching between selection of the high reference voltage and the further high reference voltage for output to the second input of the first comparator circuit is controlled by a third control signal; and
   a fourth switch multiplexer circuit having a first input configured to receive the low reference voltage, a second input configured to receive the further low reference voltage and an output coupled to the second input of the second comparator circuit;
   wherein switching between selection of the low reference voltage and the further low reference voltage for output to the second input of the second comparator circuit is controlled by a fourth control signal.

12. The optical device of claim 11, wherein the second resistive divider circuit comprises a series connection of a plurality of resistances, with the high reference voltage being output from a first tap of the second resistive divider circuit, the further high reference voltage being output from a second tap of the second resistive divider circuit, the low reference voltage being output from a third tap of the second resistive divider circuit and the further low reference voltage being output from a fourth tap of the second resistive divider circuit.

13. The optical device of claim 12, wherein the plurality of resistances comprise a second resistance, a third resistance, a fourth resistance and a fifth resistance coupled in series, and wherein the first tap is at a terminal of the second resistance, the second tap is a tap at a terminal of the third resistance, the third tap is at a terminal of the fourth resistance, and the fourth tap is at a terminal of the fifth resistance.

14. A sensing circuit for an optical device which includes an optical element with a conductive trace and a light source that outputs a light beam passing through said optical element, comprising:
   a first current source configured to source a first current to a first resistive divider circuit which includes a first pad and a second pad configured for connection to the conductive trace;
   a second current source configured to source a second current to a second resistive divider circuit configured to output a high reference voltage and a low reference voltage;
   a first comparator circuit having a first input coupled to receive a voltage at the first pad and a second input coupled to receive the high reference voltage;
   a second comparator circuit having a first input coupled to receive a voltage at the second pad and a second input coupled to receive the low reference voltage; and
   a combinational logic circuit configured to logically combine digital signals output from the first and second comparator circuits to generate an enable signal for controlling actuation of the light source.

15. The sensing circuit of claim 14, wherein the first resistive divider circuit comprises a series connection of a trace resistance provided by said conductive trace and a first resistance coupled between the second pad and a reference supply node.

16. The sensing circuit of claim 14, wherein the second resistive divider circuit comprises a series connection of a plurality of resistances, with the high reference voltage being output from a first tap of the second resistive divider circuit and the low reference voltage being output from a second tap of the second resistive divider circuit.

17. The sensing circuit of claim 16, wherein the plurality of resistances comprises a second resistance and a third resistance coupled in series, and wherein a first tap is at a terminal of the second resistance and the second tap is a tap at a terminal of the third resistance.

18. The sensing circuit of claim 14, wherein the sensing circuit further comprises:

a third comparator circuit having a first input coupled to receive a voltage at the second pad and a second input coupled to receive the high reference voltage; and a fourth comparator circuit having a first input coupled to receive a voltage at the first pad and a second input coupled to receive the low reference voltage; and wherein said combinational logic circuit is configured to logically combine digital signals output from the first, second, third and fourth comparator circuits to generate said enable signal.

19. The sensing circuit of claim 18, wherein the second resistive divider circuit comprises a series connection of a plurality of resistances, with the high reference voltage being output from a first tap of the second resistive divider circuit, the further high reference voltage being output from a second tap of the second resistive divider circuit, the low reference voltage being output from a third tap of the second resistive divider circuit and the further low reference voltage being output from a fourth tap of the second resistive divider circuit.

20. The optical device of claim 19, wherein the plurality of resistances comprise a second resistance, a third resistance, a fourth resistance and a fifth resistance coupled in series, and wherein the first tap is at a terminal of the second resistance, the second tap is a tap at a terminal of the third resistance, the third tap is at a terminal of the fourth resistance, and the fourth tap is at a terminal of the fifth resistance.

21. The sensing circuit of claim 14, wherein the sensing circuit further comprises:

a first switch multiplexer circuit having a first input configured to receive the voltage at the first pad, a second input configured to receive the voltage at the second pad and an output coupled to the first input of the first comparator circuit;

wherein switching between selection of the voltages at the first and second pads for output to the first input of the first comparator circuit is controlled by a first control signal; and a second switch multiplexer circuit having a first input configured to receive the voltage at the first pad, a second input configured to receive the voltage at the second pad and an output coupled to the first input of the second comparator circuit;

wherein switching between selection of the voltages at the first and second pads for output to the first input of the second comparator circuit is controlled by a second control signal.

22. The sensing circuit of claim 21, wherein the first and second control signals are generated by a control circuit in response to a clock signal.

23. The sensing circuit of claim 22, wherein said control circuit generates a further enable signal in response to said clock signal and wherein said combinational logic circuit is configured to logically combine digital signals output from the first and second comparator circuits with said further enable signal to generate said enable signal.

24. The sensing circuit of claim 21, wherein the second resistive divider circuit is configured to further output a further high reference voltage and a further low reference voltage, and wherein the sensing circuit further comprises:

a third switch multiplexer circuit having a first input configured to receive the high reference voltage, a second input configured to receive the further high reference voltage and an output coupled to the second input of the first comparator circuit;

wherein switching between selection of the high reference voltage and the further high reference voltage for output to the second input of the first comparator circuit is controlled by a third control signal; and a fourth switch multiplexer circuit having a first input configured to receive the low reference voltage, a second input configured to receive the further low reference voltage and an output coupled to the second input of the second comparator circuit;

wherein switching between selection of the low reference voltage and the further low reference voltage for output to the second input of the second comparator circuit is controlled by a fourth control signal.

25. The sensing circuit of claim 24, wherein the second resistive divider circuit comprises a series connection of a plurality of resistances, with the high reference voltage being output from a first tap of the second resistive divider circuit, the further high reference voltage being output from a second tap of the second resistive divider circuit, the low reference voltage being output from a third tap of the second resistive divider circuit and the further low reference voltage being output from a fourth tap of the second resistive divider circuit.

26. The sensing circuit of claim 25, wherein the plurality of resistances comprise a second resistance, a third resistance, a fourth resistance and a fifth resistance coupled in series, and wherein the first tap is at a terminal of the second resistance, the second tap is a tap at a terminal of the third resistance, the third tap is at a terminal of the fourth resistance, and the fourth tap is at a terminal of the fifth resistance.

* * * * *